United States Patent
Hsu et al.

(10) Patent No.: US 11,942,375 B2
(45) Date of Patent: Mar. 26, 2024

(54) STRUCTURE AND FORMATION METHOD OF SEMICONDUCTOR DEVICE WITH FIN STRUCTURES

(71) Applicant: Taiwan Semiconductor Manufacturing Co., Ltd., Hsin-Chu (TW)

(72) Inventors: Hsing-Hui Hsu, Hsinchu (TW); Po-Nien Chen, Miaoli County (TW); Yi-Hsuan Chung, Hsinchu (TW); Bo-Shiuan Shie, Hsinchu (TW); Chih-Yung Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 34 days.

(21) Appl. No.: 17/404,443

(22) Filed: Aug. 17, 2021

(65) Prior Publication Data
US 2021/0375697 A1    Dec. 2, 2021

Related U.S. Application Data

(63) Continuation of application No. 16/526,692, filed on Jul. 30, 2019, now Pat. No. 11,094,597.
(Continued)

(51) Int. Cl.
*H01L 21/8238* (2006.01)
*H01L 21/02* (2006.01)
(Continued)

(52) U.S. Cl.
CPC ............ *H01L 21/823821* (2013.01); *H01L 21/02532* (2013.01); *H01L 21/823807* (2013.01);
(Continued)

(58) Field of Classification Search
CPC ............ H01L 29/66545; H01L 29/785; H01L 27/0924; H01L 21/823807; H01L 29/66795
See application file for complete search history.

(56) References Cited

U.S. PATENT DOCUMENTS

| 8,169,025 B2 | 5/2012 | Bedell et al. |
| 8,796,666 B1 | 8/2014 | Huang et al. |
| (Continued) | | |

FOREIGN PATENT DOCUMENTS

| KR | 20160136296 | 11/2016 |
| KR | 20170121667 | 11/2017 |
| (Continued) | | |

*Primary Examiner* — Brian Turner
(74) *Attorney, Agent, or Firm* — HAYNES AND BOONE, LLP

(57) ABSTRACT

A structure and a formation method of a semiconductor device are provided. The method includes forming a first semiconductor fin and a second semiconductor fin over a semiconductor substrate. The second semiconductor fin is wider than the first semiconductor fin. The method also includes forming a gate stack over the semiconductor substrate, and the gate stack extends across the first semiconductor fin and the second semiconductor fin. The method further includes forming a first source/drain structure on the first semiconductor fin, and the first source/drain structure is p-type doped. In addition, the method includes forming a second source/drain structure on the second semiconductor fin, and the second source/drain structure is n-type doped.

20 Claims, 20 Drawing Sheets

Related U.S. Application Data

(60) Provisional application No. 62/738,098, filed on Sep. 28, 2018.

(51) Int. Cl.
*H01L 27/092* (2006.01)
*H01L 29/66* (2006.01)
*H01L 29/78* (2006.01)

(52) U.S. Cl.
CPC ........ *H01L 21/823814* (2013.01); *H01L 21/823842* (2013.01); *H01L 21/823871* (2013.01); *H01L 27/0924* (2013.01); *H01L 27/0928* (2013.01); *H01L 29/66545* (2013.01); *H01L 29/66795* (2013.01); *H01L 29/785* (2013.01); *H01L 21/823892* (2013.01); *H01L 29/7848* (2013.01)

(56) References Cited

U.S. PATENT DOCUMENTS

| | | |
|---|---|---|
| 8,815,712 B2 | 8/2014 | Wan et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,256,099 B1* | 4/2019 | Akaiwa ............... H01L 29/7851 |
| 2002/0130393 A1 | 9/2002 | Takayanagi et al. |
| 2011/0068407 A1 | 3/2011 | Yeh et al. |
| 2013/0224936 A1* | 8/2013 | Lee ................. H01L 21/823431 438/492 |
| 2013/0285116 A1 | 10/2013 | Lochtefeld et al. |
| 2015/0372139 A1 | 12/2015 | Wei et al. |
| 2016/0093726 A1* | 3/2016 | Ching ............... H01L 29/7848 257/192 |
| 2016/0126343 A1* | 5/2016 | Ching ............... H01L 29/0653 257/192 |
| 2016/0293736 A1 | 10/2016 | Cheng et al. |
| 2016/0343621 A1* | 11/2016 | Cheng ............ H01L 21/823878 |
| 2016/0343623 A1 | 11/2016 | Fogel et al. |
| 2016/0372473 A1 | 12/2016 | Cheng et al. |
| 2017/0179274 A1* | 6/2017 | Karve ............... H01L 29/0638 |
| 2017/0250183 A1 | 8/2017 | Brunco |
| 2017/0263748 A1 | 9/2017 | Kittl et al. |
| 2017/0365525 A1 | 12/2017 | Bergendahl et al. |
| 2017/0373150 A1* | 12/2017 | Cheng ............ H01L 21/823807 |
| 2018/0247938 A1* | 8/2018 | Cheng ............ H01L 21/823821 |
| 2019/0019891 A1* | 1/2019 | Glass ............ H01L 21/823821 |
| 2019/0115263 A1* | 4/2019 | Bi ................. H01L 21/3065 |
| 2019/0237580 A1* | 8/2019 | Bi ................. H01L 27/1211 |

FOREIGN PATENT DOCUMENTS

| | | |
|---|---|---|
| KR | 20180016351 | 2/2018 |
| TW | I559548 B | 11/2016 |
| TW | I563574 B | 12/2016 |
| TW | I604607 B | 11/2017 |

* cited by examiner

STRUCTURE AND FORMATION METHOD OF SEMICONDUCTOR DEVICE WITH FIN STRUCTURES

PRIORITY DATA

This application is a continuation application of U.S. patent application Ser. No. 16/526,692, filed Jul. 30, 2019, which is a non-provisional application of and claims the benefit of U.S. Provisional Patent Application Ser. No. 62/738,098, filed Sep. 28, 2018, the entire disclosures of which are incorporated herein by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
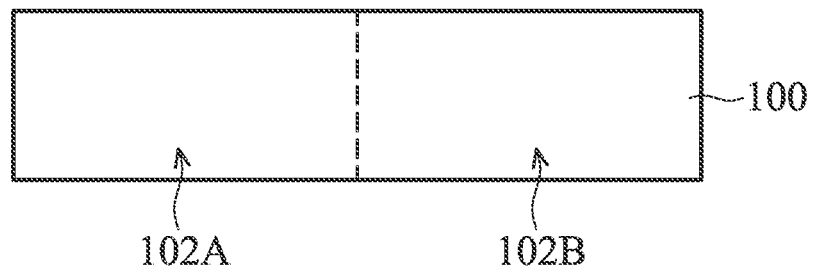
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIGS. 1A-1I are cross-sectional views of various stages of a process for forming a semiconductor device structure, in accordance with some embodiments. FIG. 2 is a perspective view of a semiconductor device structure, in accordance with some embodiments. In some embodiments, FIGS. 1A-1I are cross-sectional views of various stages of a process for forming the structure shown in FIG. 2 taken along line I-I in FIG. 2.

Figure 2:
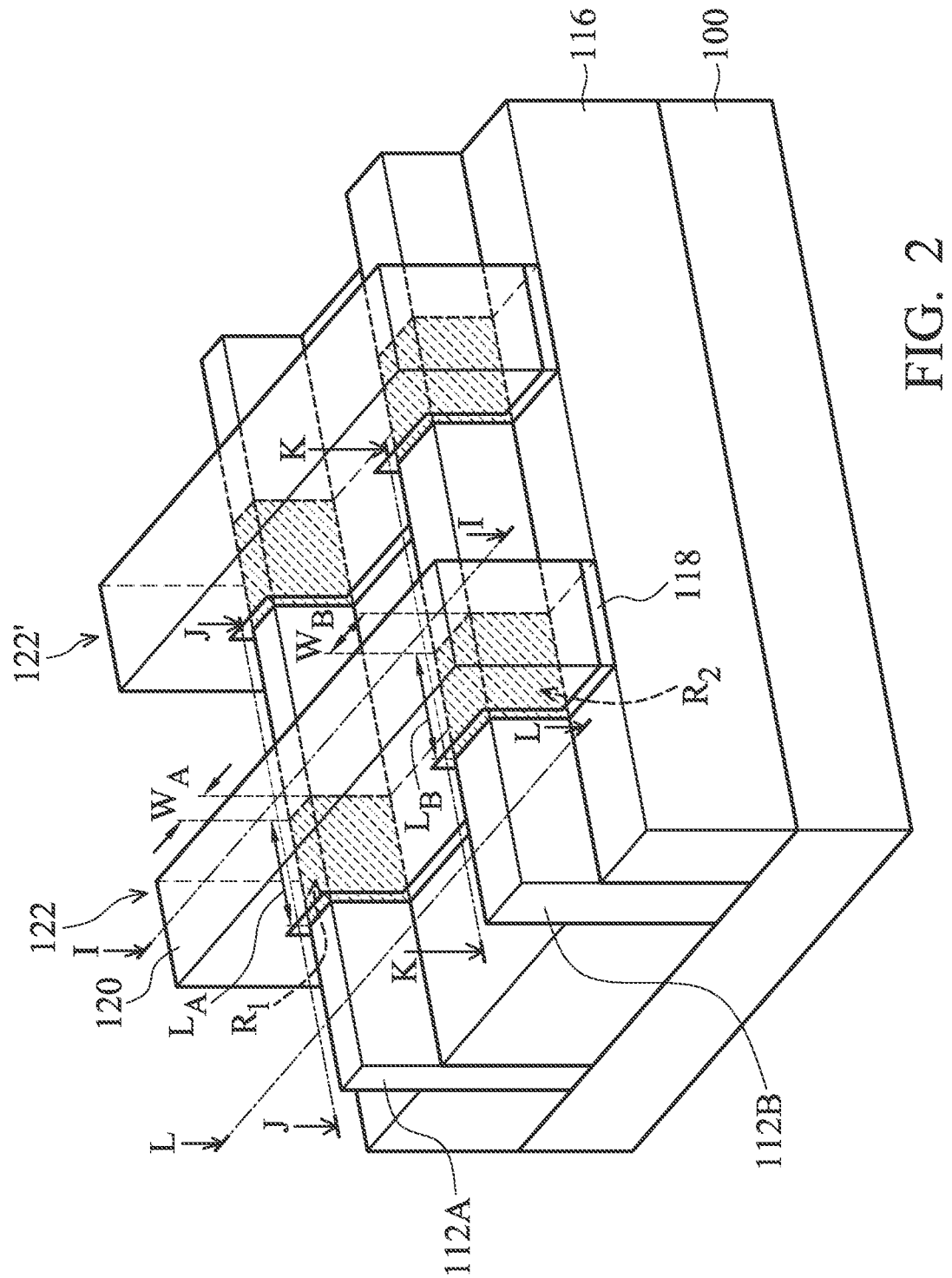
FIG. 2 is a perspective view of a semiconductor device structure, in accordance with some embodiments.

As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{x1}Ga_{x2}In_{x3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, portions of the semiconductor substrate 100 are doped with dopants to form well regions. Multiple ion implantation processes may be used to form the well regions. As shown in FIG. 1A, well regions 102A and 102B are formed using multiple ion implantation processes. In some embodiments, the well region 102A is an N-well region, and the well region 102B is a P-well region.

Figure 1B:
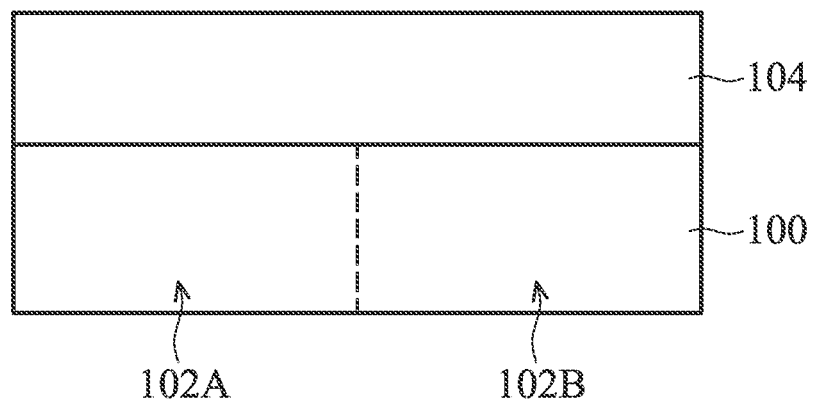

As shown in FIG. 1B, a semiconductor material 104 is formed over the semiconductor substrate 100, in accordance with some embodiments. In some embodiments, the semiconductor material 104 is made of or includes silicon or the like. In some embodiments, the semiconductor material 104 is epitaxially grown over the semiconductor substrate. In some embodiments, the semiconductor material 104 is p-type doped. The semiconductor material 104 may be used to form fin channels of NMOS devices.

Figure 1C:
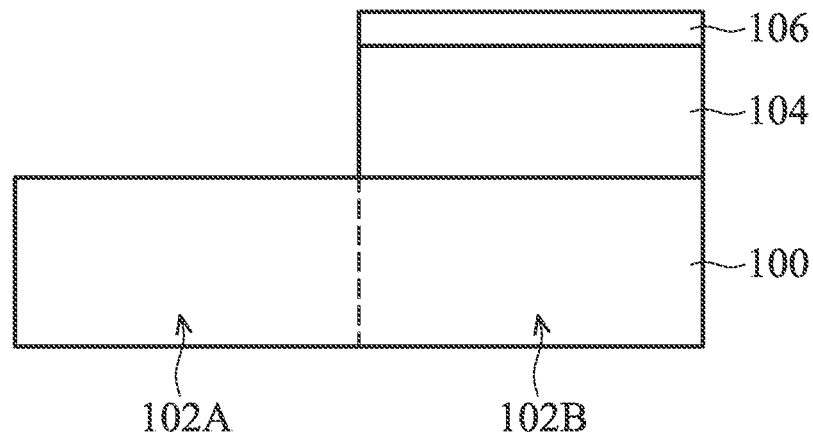

As shown in FIG. 1C, a patterned mask element 106 is formed over the semiconductor material 104 to assist in a subsequent patterning process of the semiconductor material 104, in accordance with some embodiments. The patterned mask element may be made of or include an oxide material, a nitride material, a photoresist material, one or more other suitable materials, or a combination thereof. Afterwards, one or more etching processes are used to remove the semiconductor material 104 that is not protected by the mask element 106. As a result, the semiconductor material 104 is patterned. A portion of the semiconductor substrate 100 (such as the well region 102A) is exposed. Afterwards, the mask element 106 may be removed.

Figure 1D:
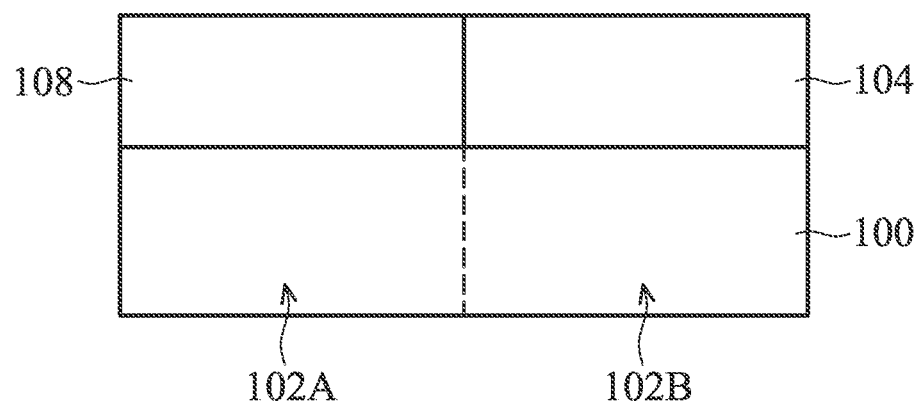

As shown in FIG. 1D, a semiconductor material 108 is formed over the well region 102A, in accordance with some embodiments. The semiconductor material 108 and the semiconductor material 104 are made of different materials. In some embodiments, the semiconductor material 108 is made of or includes silicon germanium, germanium, or the like. In some embodiments, the semiconductor material 108 is epitaxially grown over the well region 102A. In some embodiments, the semiconductor material 108 is n-type doped. The semiconductor material 108 may be used to form fin channels of PMOS devices. In some embodiments, a chemical mechanical polishing (CMP) process is performed to planarize the semiconductor material 108. In some embodiments the CMP process planarizes the semiconductor material 104. In some embodiments, the CMP process planarizes the semiconductor material 108 and semiconductor material 104 to form a substantially flat top surface.

Many variations and/or modifications can be made to embodiments of the disclosure. In some other embodiments, the semiconductor material 108 is formed before the semiconductor material 104.

Figure 1E:
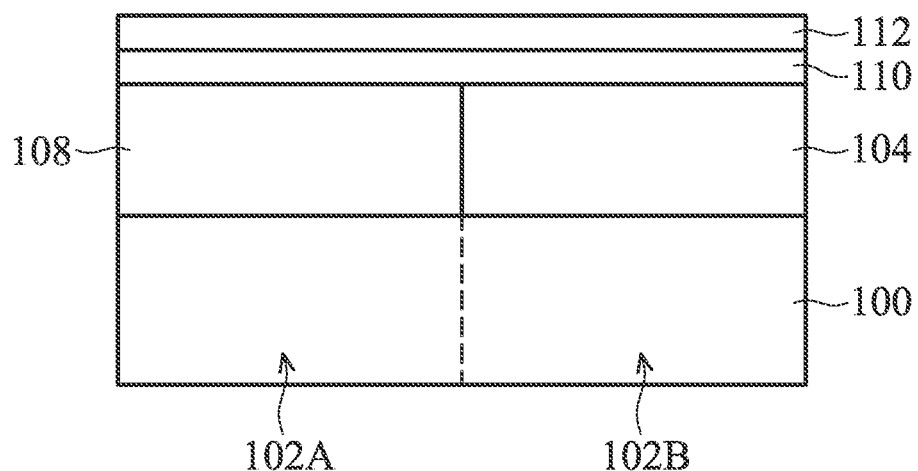

As shown in FIG. 1E, a pad layer 110 and a mask layer 112 are formed over the semiconductor materials 104 and 104, in accordance with some embodiments. The pad layer 110 may be used to buffer the mask layer 112 and the semiconductor materials 104 and 108 thereunder so that less stress is generated. The pad layer 110 may also function as an etch stop layer for etching the mask layer 112.

In some embodiments, the pad layer 110 is made of or includes silicon oxide, germanium oxide, silicon germanium oxide, one or more other suitable materials, or a combination thereof. The pad layer 110 may be formed using a thermal process, a chemical vapor deposition (CVD) process, an atomic layer deposition (ALD) process, one or more other applicable processes, or a combination thereof.

In some embodiments, the mask layer 112 is made of or includes silicon nitride, silicon oxynitride, one or more other suitable materials, or a combination thereof. The mask layer 112 may be formed using a CVD process, a thermal nitridation process, an ALD process, one or more other applicable processes, or a combination thereof.

Figure 1F:
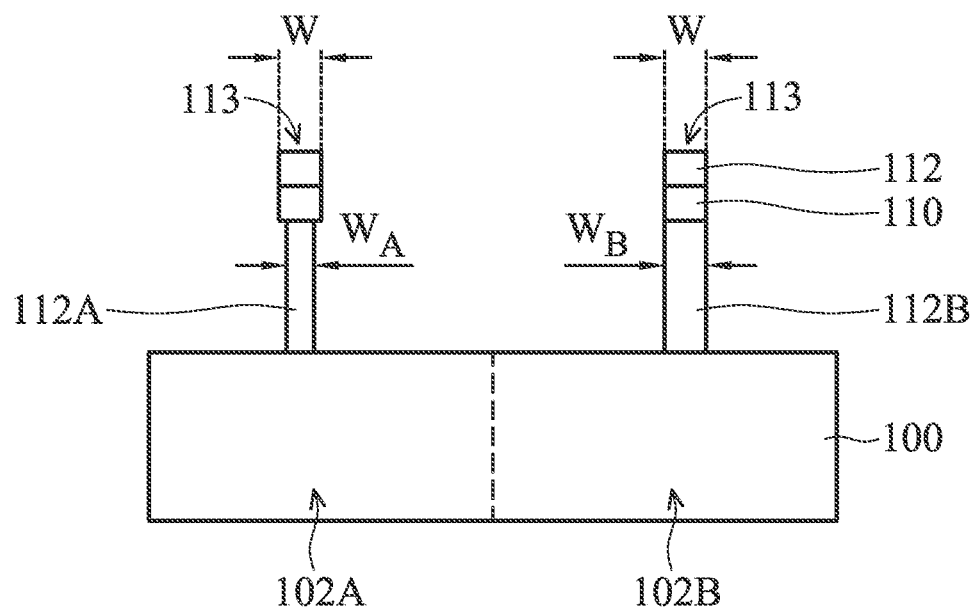

As shown in FIG. 1F, the mask layer 112 and the pad layer 110 are patterned to form mask elements 113, in accordance with some embodiments. A patterned photoresist layer may be used to assist in the formation of the mask elements 113. One or more etching processes are used to partially remove the mask layer 112 and the pad layer 110. As a result, the mask elements 113 are formed. The mask elements 113 define the pattern to be transferred to the semiconductor materials 104 and 108 thereunder. The mask elements 113 are used to define semiconductor fins. Each of the mask elements 113 may have a width W.

Afterwards, the semiconductor materials 104 and 108 are partially etched with the mask elements 113 as an etching mask, as shown in FIG. 1F in accordance with some embodiments. One or more etching processes may be used to partially remove the semiconductor materials 104 and 108. As a result, semiconductor fins 112A and 112B are formed, as shown in FIG. 1F. A remaining portion of the semiconductor material 108 forms the semiconductor fin 112A. A remaining portion of the semiconductor material 104 forms the semiconductor fin 112B.

In some embodiments, the semiconductor fin 112A is used for forming a PMOS device, and the semiconductor fin 112B is used for forming an NMOS device. As shown in FIG. 1F, the semiconductor fin 112A has a width $W_A$, and the semiconductor fin 112B has a width $W_B$. The widths $W_A$ and $W_B$ may be the widths of the tops of the semiconductor fins 112A and 112B, respectively. In some embodiments, the width $W_B$ is greater than the width $W_A$. The semiconductor fin 112B is wider than the semiconductor fin 112A. In some embodiments, the semiconductor fins 112A and 112B have vertical sidewalls. In some other embodiments, the semiconductor fins 112A and 112B have slanted sidewalls. In some embodiments, each of the semiconductor fins 112A and 112B becomes wider along a direction from the fin top towards the fin bottom.

In some embodiments, the width $W_A$ is in a range from about 4 nm to about 6 nm. In some embodiments, the width $W_B$ is in a range from about 6 nm to about 7 nm. In some embodiments, a width ratio ($W_B/W_A$) of the width $W_B$ to the width $W_A$ is in a range from about 1.05 to about 2. In some other embodiments, the width ratio ($W_B/W_A$) is in a range from about 1.1 to about 1.3.

In some embodiments, the semiconductor materials 108 and 104 are partially removed to respectively form the semiconductor fins 112A and 112B using the same etching process. In some embodiments, the semiconductor fins 112A and 112B are formed simultaneously. For example, once the etching process mentioned above is finished, the semiconductor fins 112A and 112B are formed.

However, many variations and/or modifications can be made to embodiments of the disclosure. In some other embodiments, the semiconductor fins 112A and 112B are not formed simultaneously. In some embodiments, the semiconductor fins 112A and 112B are separately formed using different photolithography processes and etching processes.

As mentioned above, the semiconductor materials 108 and 104 are made of different materials. In the etching process for forming the semiconductor fins 112A and 112B, an etchant is used in the etching process. In some embodiments, the etchant used in the etching process etches the semiconductor material 108 and the semiconductor material 104 at different rates. In some embodiments, the etchant etches the semiconductor material 108 at a greater rate than the semiconductor material 104. Because the semiconductor material 108 is etched at a greater rate than the semiconductor material 104, the semiconductor fin 112A is formed to be narrower than the semiconductor fin 112B.

Figure 1G:
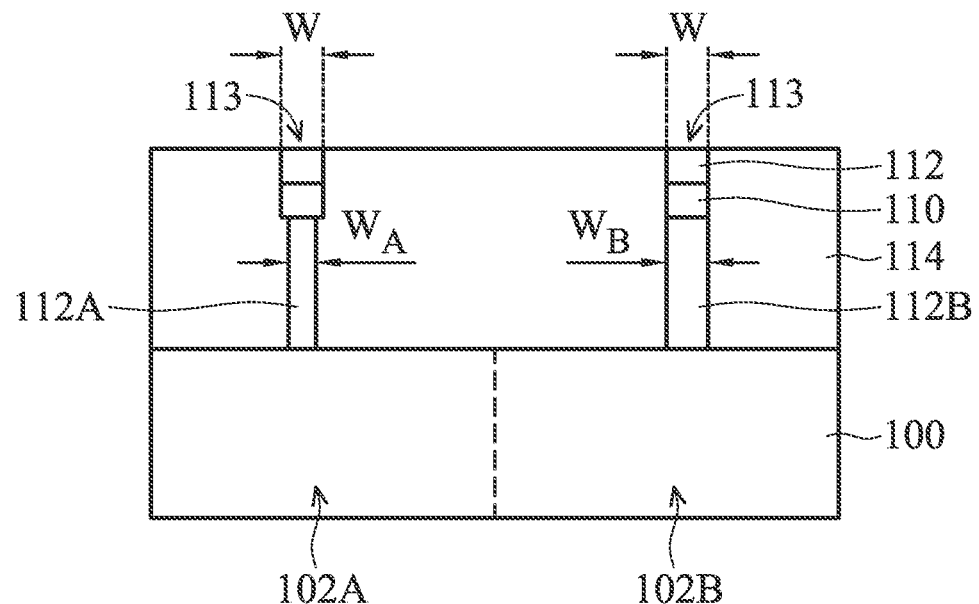

As shown in FIG. 1G, a dielectric material layer 114 is deposited over the semiconductor substrate 100, in accordance with some embodiments. The dielectric material layer 114 surrounds the semiconductor fins 112A and 112B. The dielectric material layer 114 may be made of or include silicon oxide, silicon nitride, silicon oxynitride, fluorinated silicate glass (FSG), low-K dielectric material, one or more other suitable materials, or a combination thereof. The dielectric material layer may be deposited using a CVD process, an ALD process, a PVD process, a spin-on process, one or more other applicable processes, or a combination thereof.

A planarization process is then used to thin the dielectric material layer 114 until the mask elements 113 are exposed. The planarization process may include a chemical mechanical polishing (CMP) process, a grinding process, a dry polishing process, an etching process, one or more other applicable processes, or a combination thereof.

Figure 1H:
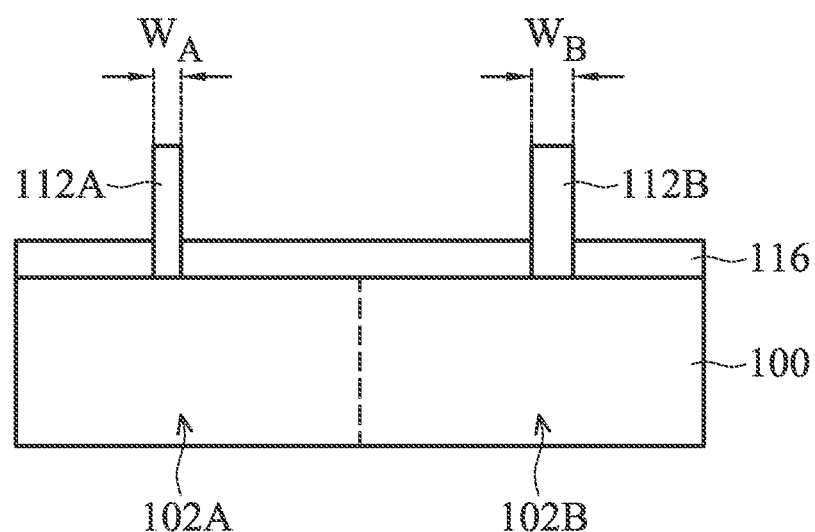

As shown in FIG. 1H, the mask elements 113 are removed, and the dielectric material layer 114 is partially removed, in accordance with some embodiments. For example, the dielectric material layer 114 is etched back. As a result, the remaining portions of the dielectric material layer 114 form isolation features 116. The isolation features 116 surround lower portions of the semiconductor fins 112A and 112B.

Figure 1I:
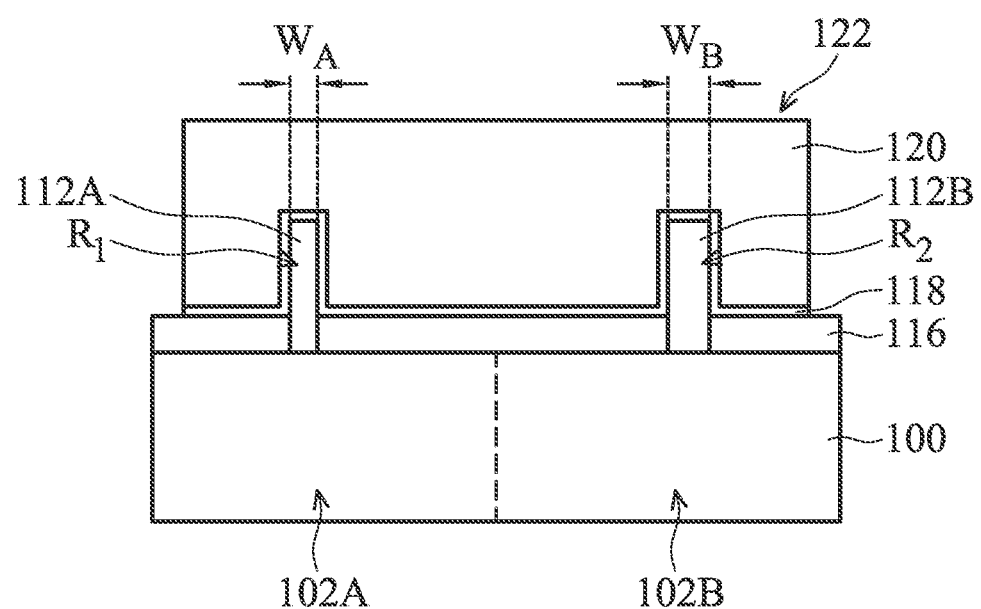

As shown in FIG. 1I, a gate stack 122 is formed over the semiconductor substrate 100 to partially cover the semiconductor fins 112A and 112B, as shown in FIG. 1I in accordance with some embodiments. The gate stack 122 extends across the semiconductor fins 112A and 112B. The gate stack 122 includes a gate electrode 120 and a gate dielectric layer 118. In some embodiments, a gate dielectric material layer and a gate electrode material layer are deposited over the isolation features 116 and the semiconductor fins 112A and 112B. Afterwards, the gate dielectric material layer and the gate electrode material layer are patterned to form the gate stack 122 including the gate electrode 120 and the gate dielectric layer 118. In some embodiments, another gate stack 122' is also formed from patterning the gate dielectric material layer and the gate electrode material layer, as shown in FIG. 2. Each of the gate stacks 122 and 122' extend across the semiconductor fins 112A and 112B.

As shown in FIG. 2, the gate stack 122 or 122' is formed to extend across no semiconductor fin except for the semiconductor fins 112A and 112B, in accordance with some embodiments. That is, the gate stack 122 or 122' is formed to extend across the semiconductor fins 112A and 112B and no other semiconductor fins. Therefore, the size of the semiconductor device structure may be reduced further to occupy a smaller wafer area. The operation speed of the semiconductor device structure may be improved accordingly.

The gate stack 122 extends across the semiconductor fin 112A to cover a region $R_1$ of the semiconductor fin 112A. The gate stack 122 also extends across the semiconductor fin 112B to cover a region $R_2$ of the semiconductor fin 112B. In some embodiments, the region $R_1$ serves as a channel region of a PMOS device, and the region $R_2$ serves as a channel region of an NMOS device. In some other embodiments, a portion of the region $R_1$ serves as a channel region of a PMOS device, and a portion of the region $R_2$ serves as a channel region of an NMOS device.

In some embodiments, the PMOS device and NMOS device mentioned above together form a CMOS device. In some embodiments, the regions $R_1$ and $R_2$ are the only two channel regions covered by or controlled by the gate stack 122. As shown in FIG. 2, the region $R_1$ has the width $W_A$ that is smaller than the width $W_B$ of the region $R_2$. The region $R_1$ has a length $L_A$, and the region $R_2$ has a length $L_B$. In some embodiments, the length $L_A$ is substantially equal to the length $L_B$.

In some embodiments, the gate dielectric material layer for forming the gate dielectric layer 118 is made of or includes silicon oxide, silicon nitride, silicon oxynitride, dielectric material with a high dielectric constant (high-K), one or more other suitable dielectric materials, or a combination thereof. In some embodiments, the gate dielectric material layer is a dummy gate dielectric layer that will be subsequently removed. The dummy gate dielectric material layer is, for example, a silicon oxide layer.

In some embodiments, the gate dielectric material layer is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the gate electrode material layer is made of or includes polysilicon, amorphous silicon, germanium, silicon germanium, one or more other suitable materials, or a combination thereof. In some embodiments, the gate electrode material layer is a dummy gate electrode layer that is made of or includes a semiconductor material such as polysilicon. For example, the dummy gate electrode layer is deposited using a CVD process or another applicable process.

Figure 3A:
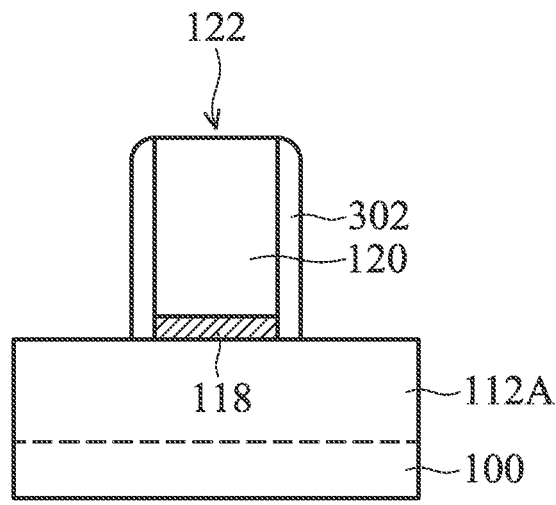
FIGS. 3A-3I are cross-sectional views of various stages of a process for forming a semiconductor device structure, in accordance with some embodiments.

Afterwards, epitaxial growth processes and gate replacement processes are performed to respectively form source/drain structures and a metal gate stack, in accordance with some embodiments. FIGS. 3A-3I are cross-sectional views of various stages of a process for forming a semiconductor device structure, in accordance with some embodiments. In some embodiments, FIG. 3A shows a cross-sectional view of the structure shown in FIG. 2 taken along line J-J. FIGS. 4A-4F are cross-sectional views of various stages of a process for forming a semiconductor device structure, in accordance with some embodiments. In some embodiments, FIG. 4A shows a cross-sectional view of the structure shown in FIG. 2 taken along line L-L.

As shown in FIGS. 3A, spacer elements 302 are formed over the sidewalls of the gate stack 122, in accordance with some embodiments. The spacer elements 302 may be used to assist in the formation of source and drain structures (or regions) in subsequent processes. In some embodiments, the spacer elements 302 are made of or include silicon nitride, silicon oxynitride, silicon carbide, silicon carbon oxynitride, one or more other suitable materials, or a combination thereof.

In some embodiments, a spacer layer is deposited over the semiconductor substrate 100, the semiconductor fins 112A and 112B, and the gate stack 122. The spacer layer may be deposited using a CVD process, an ALD process, a PVD process, a spin-on process, one or more other applicable processes, or a combination thereof. Afterwards, an etching process, such as an anisotropic etching process, is performed to partially remove the spacer layer. As a result, the remaining portions of the spacer layer over the sidewalls of the gate stack 122 form the spacer elements 302.

Afterwards, a mask element 402 is formed to cover the semiconductor fin 112B, as shown in FIG. 4A in accordance with some embodiments. The portion of the gate stack 122 over the well region 102B is also covered by the mask element 402. The mask element 402 has an opening that exposes the semiconductor fin 112A, as shown in FIG. 4A. The portion of the gate stack 122 over the well region 102A is also exposed.

Figure 3B:
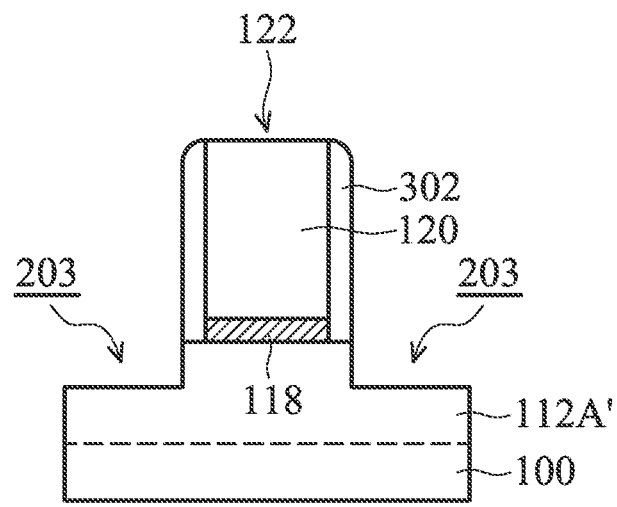
Figure 4A:
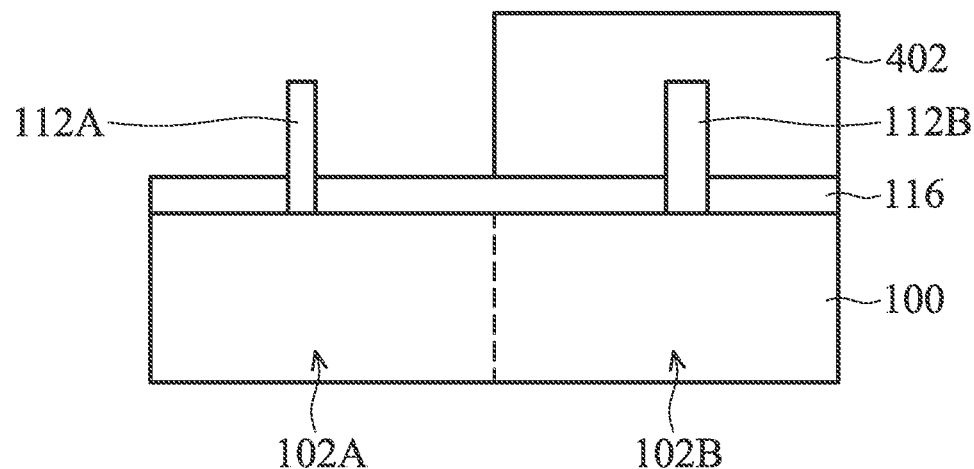
FIGS. 4A-4F are cross-sectional views of various stages of a process for forming a semiconductor device structure, in accordance with some embodiments.
Figure 4B:
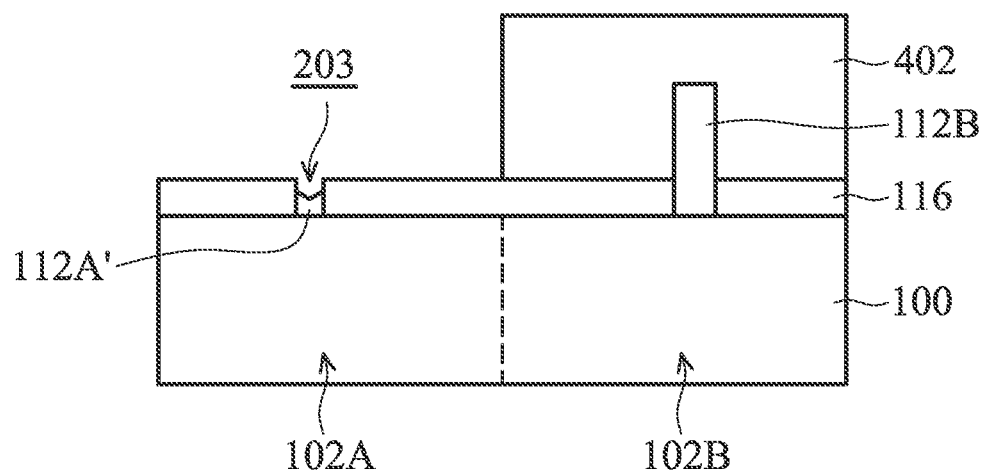

As shown in FIGS. 3B and 4B, the semiconductor fin 112A is partially removed to form recesses 203, in accordance with some embodiments. As a result, a recessed semiconductor fin 112A' is formed. In some embodiments, the recessed semiconductor fin 112A' is recessed to a level below the top surfaces of the isolation features 116, as shown in FIG. 4B. In some other embodiments, the recessed semiconductor fin 112A' is recessed to a level above the top surfaces of the isolation features 116. In some embodiments, one or more etching processes is/are used to form the recesses 203.

Many variations and/or modifications can be made to embodiments of the disclosure. In some other embodiments, the semiconductor fin 112A is not recessed. In some other embodiments, the semiconductor fin 112A is merely thinned without being recessed to a level below the top surfaces of the isolation features 116.

Figure 3C:
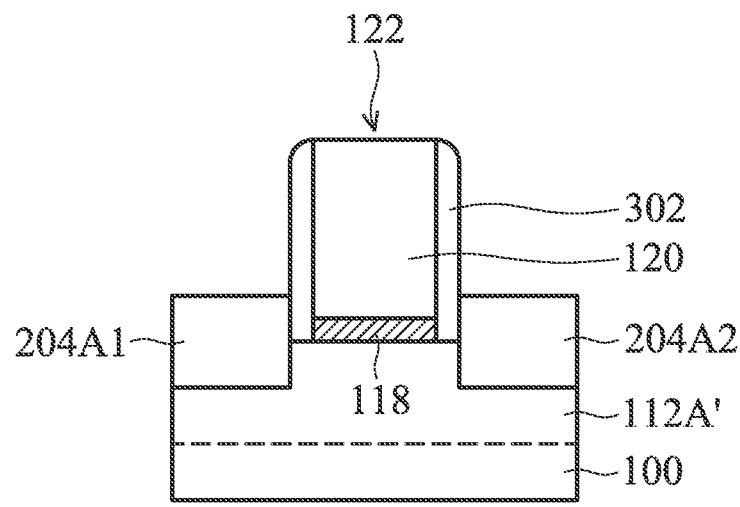
Figure 4C:
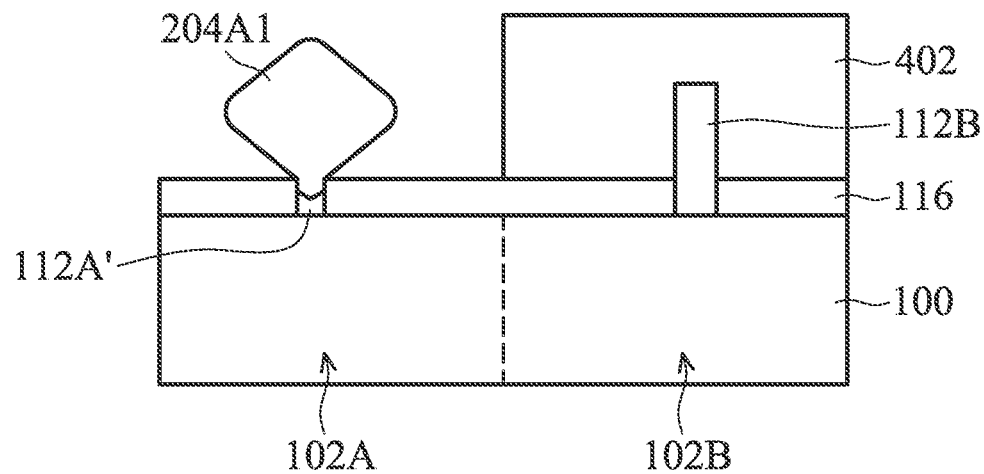

As shown in FIGS. 3C and 4C, one or more semiconductor materials are epitaxially grown over the recessed semiconductor fin 112A', in accordance with some embodiments. As a result, epitaxial structures 204A1 and 204A2 are formed. The epitaxial structures 204A1 and 204A2 may function as source and drain structures. The epitaxial structures 204A1 and 204A2 may also function as stressors to improve carrier mobility.

In some embodiments, the epitaxial structures 204A1 and 204A2 are p-type doped and function as p-type source/drain structures. For example, the epitaxial structures 204A1 and 204A2 may include epitaxially grown silicon germanium, epitaxially grown germanium, or one or more other suitable epitaxially grown semiconductor materials. The epitaxial structures 204A1 and 204A2 may include p-type dopants such as boron, gallium, indium, one or more other suitable dopants, or a combination thereof.

In some embodiments, the epitaxial structures 204A1 and 204A2 include silicon germanium. In some embodiments, the epitaxial structures 204A1 and 204A2 have an atomic concentration of germanium that is in a range from about 10% to about 60%. In some other embodiments, the epitaxial structures 204A1 and 204A2 have an atomic concentration of germanium that is in a range from about 20% to about 40%.

In some embodiments, the epitaxial structures 204A1 and 204A2 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an ALD process, one or more other applicable processes, or a combination thereof. The process of forming the epitaxial structures 204A1 and 204A2 may use gaseous and/or liquid precursors.

In some embodiments, the epitaxial structures 204A1 and 204A2 are doped in-situ during the growth of the epitaxial structures 204A1 and 204A2. However, embodiments of the disclosure are not limited thereto. In some other embodiments, one or more doping processes are used to dope the epitaxial structures 204A1 and 204A2 after the epitaxial growth of the epitaxial structures 204A1 and 204A2. In some embodiments, the doping is achieved using an ion implantation process, a plasma immersion ion implantation process, a gas and/or solid source diffusion process, one or more other applicable processes, or a combination thereof.

In some embodiments, the epitaxial structures 204A1 and 204A2 are further exposed to one or more annealing processes to activate the dopants. For example, a rapid thermal annealing process is used. In some embodiments, the annealing process is not performed at this stage but will be performed after other epitaxial structures are formed on other regions. Therefore, dopants in these epitaxial structures may be activated together in the same annealing process.

Figure 4D:
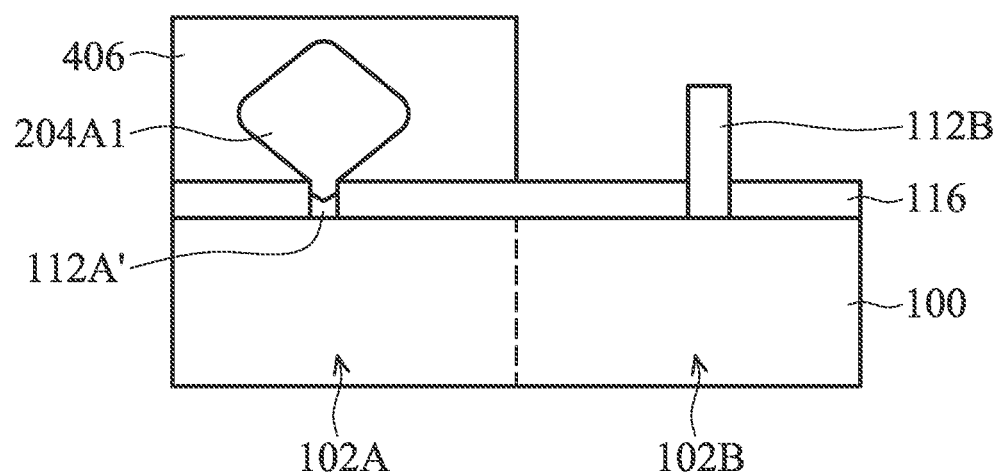

Afterwards, the mask element 402 may be removed to expose the semiconductor fin 112B and the portion of the gate stack 122 originally covered by the mask element 402, as shown in FIG. 4D. Afterwards, another mask element 406 is formed to cover the epitaxial structure 204A1, as shown in FIG. 4D in accordance with some embodiments. The epitaxial structure 204A2 (that is not shown in FIG. 4D) is also covered by the mask element 406. The portion of the gate stack 122 over the well region 102A is also covered by the mask element 406. The mask element 406 has an opening that exposes the semiconductor fin 112B. The portion of the gate stack 122 over the well region 102B is also exposed.

Figure 5A:
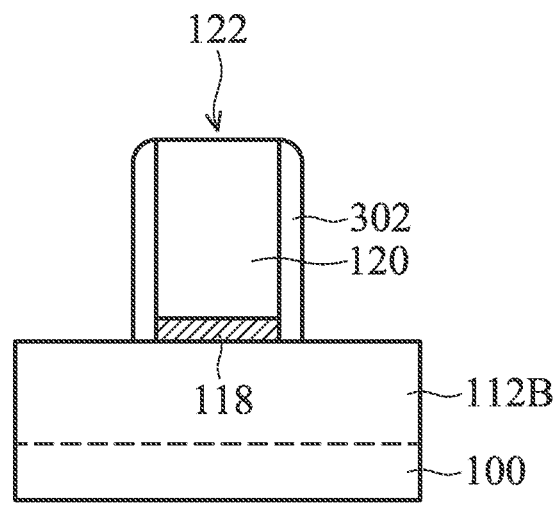
FIGS. 5A-5F are cross-sectional views of various stages of a process for forming a semiconductor device structure, in accordance with some embodiments.

FIGS. 5A-5F are cross-sectional views of various stages of a process for forming a semiconductor device structure, in accordance with some embodiments. In some embodiments, FIG. 5A shows a cross-sectional view of the structure shown in FIG. 2 taken along line K-K.

Figure 4E:
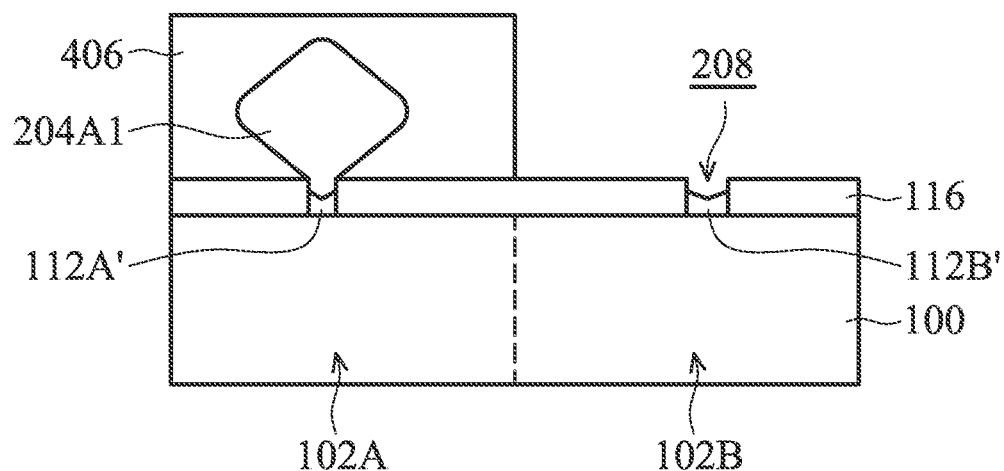

As shown in FIG. 4E, the semiconductor fin 112B is partially removed to form recesses 208, in accordance with some embodiments. As a result, a recessed semiconductor fin 112B' is formed. In some embodiments, the semiconductor fin 112B is recessed to a level below the top surfaces of the isolation features 116, as shown in FIG. 4E. In some other embodiments, the semiconductor fin 112B is recessed to a level above the top surfaces of the isolation features 116. In some embodiments, one or more etching processes is/are used to form the recesses 208.

Many variations and/or modifications can be made to embodiments of the disclosure. In some other embodiments, the semiconductor fin 112B is not recessed. In some other embodiments, the semiconductor fin 112B is merely thinned without being recessed to a level below the top surfaces of the isolation features 116.

Figure 4F:
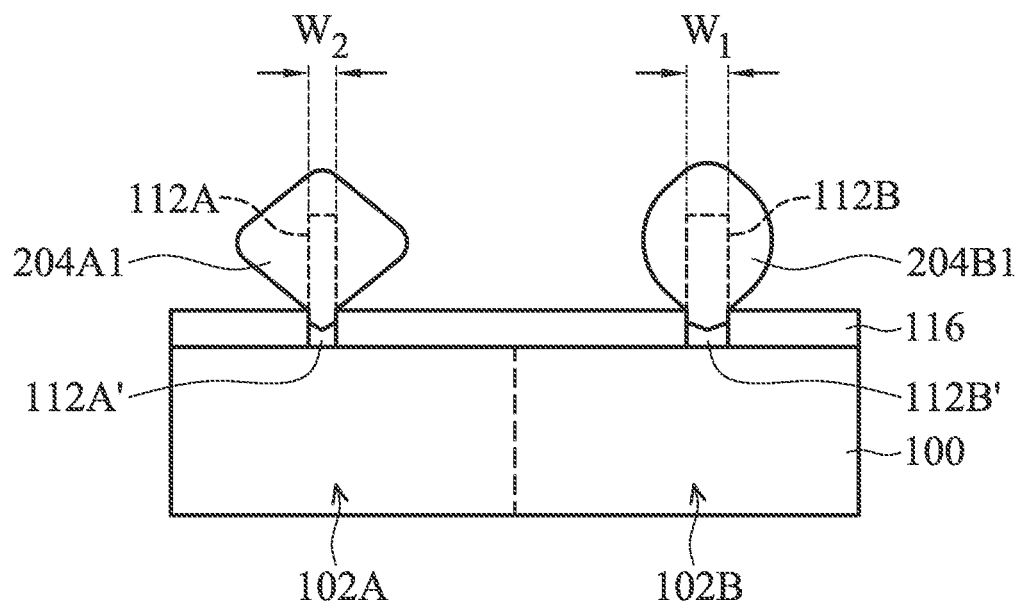
Figure 5B:
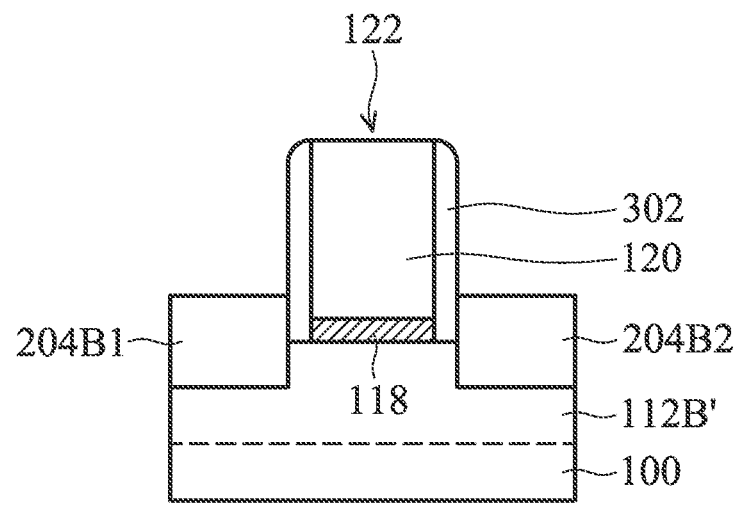

As shown in FIGS. 4F and 5B, one or more semiconductor materials are epitaxially grown over the recessed semiconductor fin 112B', in accordance with some embodiments. As a result, epitaxial structures 204B1 and 204B2 are formed. Afterwards, the mask element 406 may be removed. The epitaxial structures 204B1 and 204B2 may function as source and drain structures. The epitaxial structures 204B1 and 204B2 may also function as stressors to improve carrier mobility.

In some embodiments, the epitaxial structures 204B1 and 204B2 are n-type doped and function as n-type source/drain structures. For example, the epitaxial structures 204B1 and 204B2 may include epitaxially grown silicon or another suitable epitaxially grown semiconductor material. The epitaxial structures 204B1 and 204B2 may include n-type dopants such as phosphor, arsenic, one or more other suitable dopants, or a combination thereof.

In some embodiments, the epitaxial structures 204B1 and 204B2 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an ALD process, one or more other applicable processes, or a combination thereof. The process of forming the epitaxial structures 204B1 and 204B2 may use gaseous and/or liquid precursors.

In some embodiments, the epitaxial structures 204B1 and 204B2 are doped in-situ during the growth of the epitaxial structures 204B1 and 204B2. However, embodiments of the disclosure are not limited thereto. In some other embodiments, one or more doping processes are used to dope the epitaxial structures 204B1 and 204B2 after the epitaxial growth of the epitaxial structures 204B1 and 204B2. In some embodiments, the doping is achieved using an ion implantation process, a plasma immersion ion implantation process, a gas and/or solid source diffusion process, one or more other applicable processes, or a combination thereof.

In some embodiments, the epitaxial structures 204B1 and 204B2 are further exposed to one or more annealing processes to activate the dopants. For example, a rapid thermal annealing process is used. In some embodiments, the annealing process is used to activate the dopants in the epitaxial structures 204A1 and 204A2 and 204B at the same time.

Afterwards, a gate replacement process may be performed to replace the gate stack 122 with a metal gate stack. In some embodiments, a dielectric material layer is deposited over the epitaxial structures 204A1 and 204A2 and 204B and gate stack 122. The dielectric material layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, the dielectric material layer is deposited using a CVD process, an ALD process, a PVD process, a spin-on process, one or more other applicable processes, or a combination thereof.

Figure 3D:
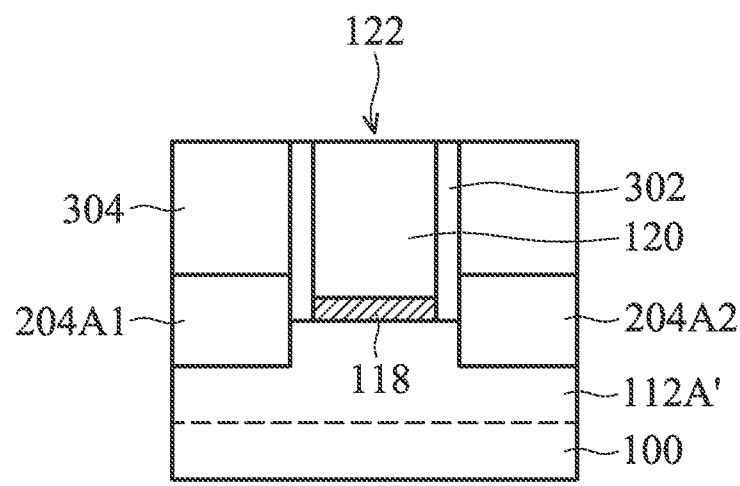

Afterwards, the dielectric material layer is thinned until the gate stack 122 is exposed, as shown in FIG. 3D in accordance with some embodiments. After the thinning process of the dielectric material layer, the remaining portion of the dielectric material layer forms a dielectric layer 304, as shown in FIG. 3D. The dielectric layer 304 surrounds the gate stack 122.

Figure 3E:
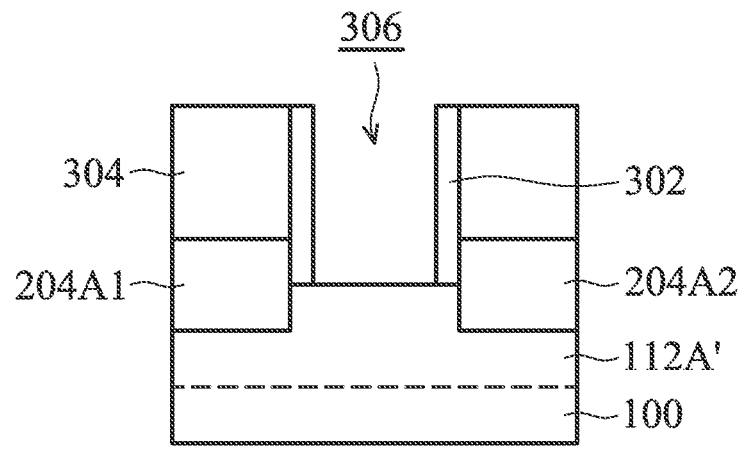

Afterwards, the gate stack 122 is removed to form a trench 306, as shown in FIG. 3E in accordance with some embodiments. One or more etching processes are used to remove the gate electrode 120 and the gate dielectric layer 118. As a result, the trench 306 is formed.

Figure 3F:
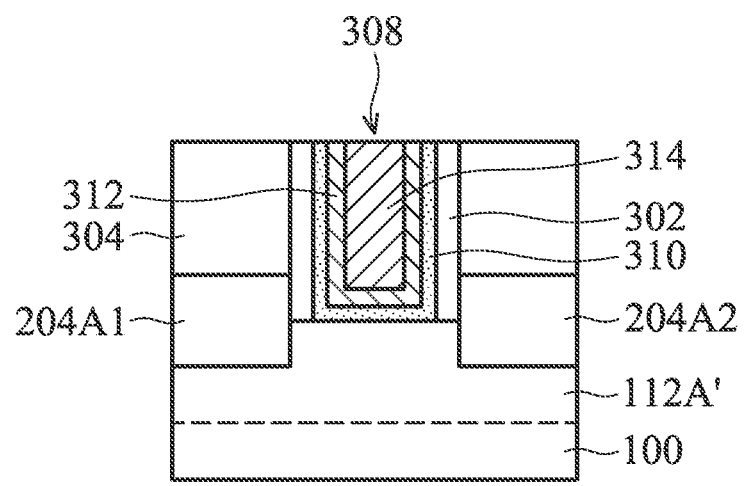
Figure 5C:
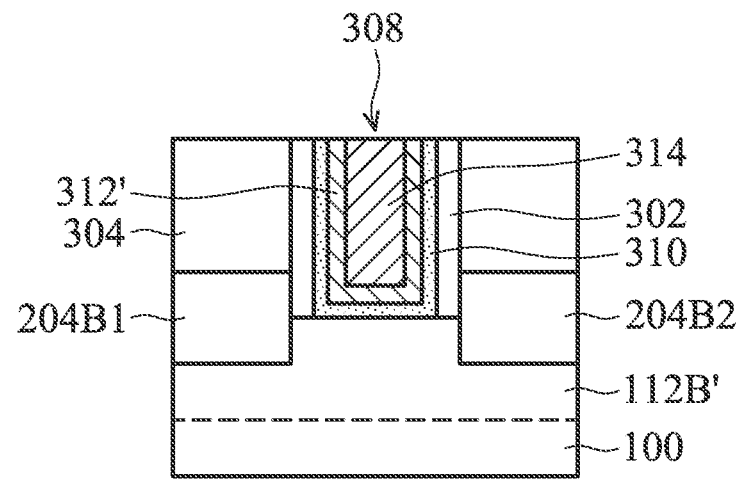

As shown in FIGS. 3F and 5C, a metal gate stack 308 is formed in the trench 306 to replace the originally formed gate stack 122, in accordance with some embodiments. The metal gate stack 308 may include a first portion extending across the recessed semiconductor fin 112A' as shown in FIG. 3F and a second portion extending across the recessed semiconductor fin 112B' as shown in FIG. 5C. As shown in FIG. 3F, the first portion of the metal gate stack 308 includes a high-k gate dielectric layer 310, a work function layer 312, and a metal filling 314. As shown in FIG. 5C, the second portion of the metal gate stack 308 includes the high-k gate dielectric layer 310, a work function layer 312', and the metal filling 314. In some embodiments, the work function layer 312 and the work function layer 312' of different portions of the metal gate stack 308 are made of different materials.

However, many variations and/or modifications can be made to embodiments of the disclosure. In some other embodiments, the work function layers 312 and 312' are made of the same material. The work function layers 312 and 312' may be the same material layer.

The metal filling 314 may be made of or include tungsten, cobalt, ruthenium, aluminum, copper, one or more other suitable materials, or a combination thereof. The high-k gate dielectric layer 310 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K dielectric materials, or a combination thereof.

The work function layers 312 and 312' are used to provide desired work function for transistors to enhance device performance including improved threshold voltage. In some embodiments, the work function layer 312' is used for forming an NMOS device. The work function layer 312' is an n-type metal layer. The n-type metal layer is capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, one or more other suitable materials, or a combination thereof.

In some embodiments, the work function layer 312 is used for forming a PMOS device. The work function layer 312 is a p-type metal layer. The p-type metal layer is capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layers 312 and 312' may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layers 312 and 312' may be fine-tuned to adjust the work function level. For example, a titanium nitride layer may be used as a p-type metal layer or an n-type metal layer, depending on the thickness and/or the compositions of the titanium nitride layer.

Multiple material layers for forming the high-k gate dielectric layer, the work function layers 112 and 112', and the metal filling 314 may be deposited over the dielectric layer 304 to fill the trench 306. Some other material layers may also be formed between these layers, such as barrier layers, buffer layers, and/or blocking layers. The deposition processes for these material layers may include an ALD process, a CVD process, a PVD process, an electroplating process, one or more other applicable processes, or a combination thereof. Different material layers for forming the work function layers 312 and 312' may be deposited separately over different regions. One or more photolithography processes and etching processes may be used to assist in the formation of different material layers over different regions.

Afterwards, a planarization process is used to remove the portions of the material layers outside of the trench 306. As a result, the remaining portions of the material layers in the trench 306 together form the metal gate stack 308, as shown in FIGS. 3F and 5C. The planarization process may include a CMP process, a grinding process, a dry polishing process, an etching process, one or more other applicable processes, or a combination thereof.

Figure 3G:
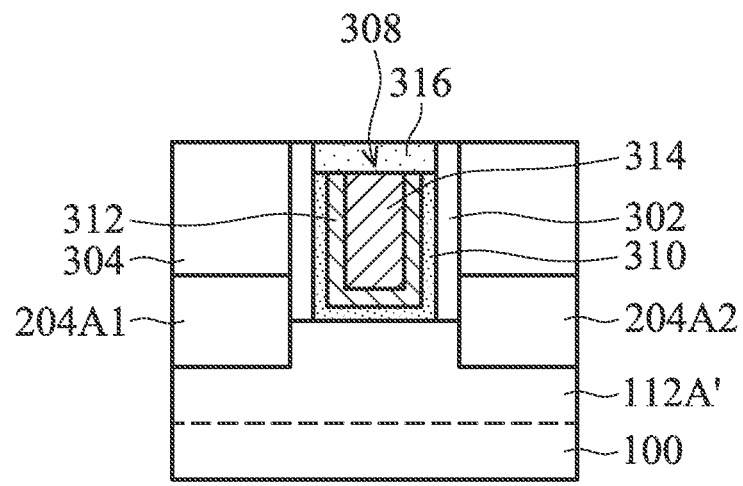
Figure 5D:
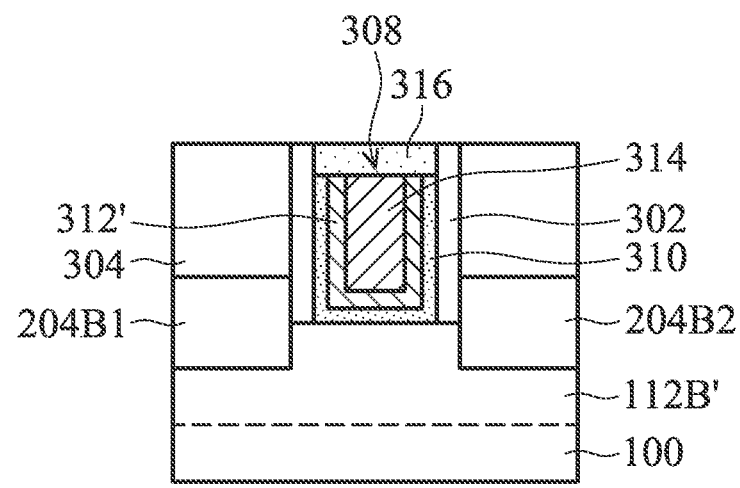

As shown in FIGS. 3G and 5D, a protective element 316 is formed over the metal gate stack 308, in accordance with some embodiments. The protective element 316 may be used to protect the metal gate stack 308 from being damaged during subsequent formation process. The protective element 316 may also be used to prevent short circuiting between the metal gate stack 308 and conductive contacts that will be formed later.

The protective element 316 may be made of or include silicon nitride, silicon oxynitride, silicon carbide, one or more other suitable materials, or a combination thereof. In some embodiments, the metal gate stack 308 is etched back before the formation of the protective element 316. One or more etching processes may be used to remove an upper portion of the metal gate stack 308. As a result, a recess surrounded by the space elements 302 is formed on the remaining portion of the metal gate stack 308. Afterwards, a protective material layer is deposited over the dielectric layer 304 to fill the recess. A planarization process is then used to remove the portion of the protective material layer outside of the recess. As a result, the remaining portion of the protective material layer in the recess forms the protective element 316.

Many variations and/or modifications can be made to embodiments of the disclosure. In some other embodiments, the metal gate stack 308 is not etched back. A patterned protective element is formed on the metal gate stack 308 to provide protection. In these cases, an interface between the protective element 316 and the metal gate stack 308 may be substantially coplanar with or higher than the top surface of the dielectric layer 304.

Figure 3H:
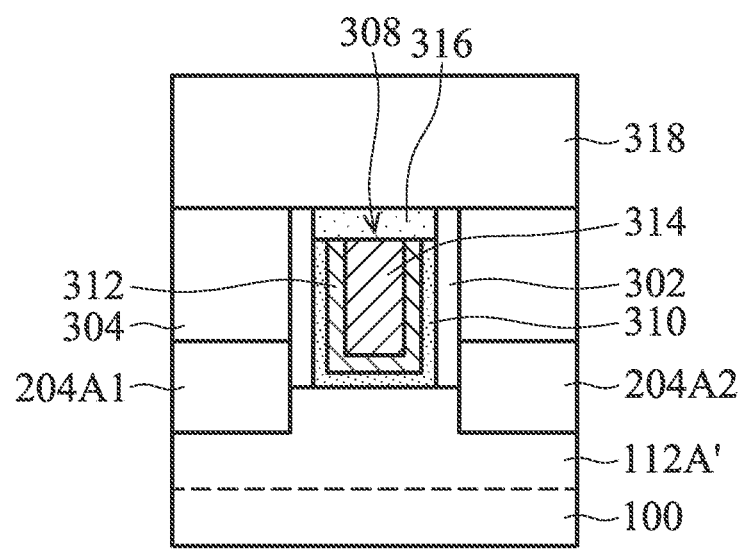
Figure 5E:
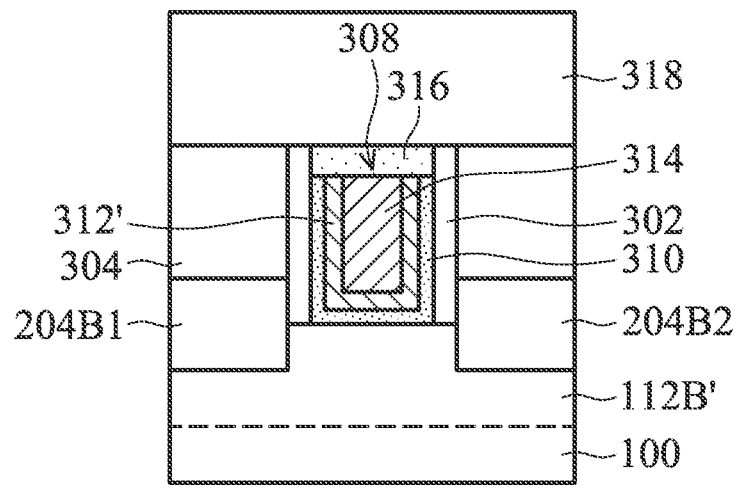

As shown in FIGS. 3H and 5E, a dielectric layer 318 is deposited over the dielectric layer 304, the spacer elements 302, the metal gate stack 308, and the protective element 316, in accordance with some embodiments. The formation method and material of the dielectric layer 318 may be the same as or similar to those of the dielectric layer 304.

Afterwards, conductive contacts are formed to provide electrical connections to the epitaxial structures 204A1, 204A2, 204B1, and 204B2, in accordance with some embodiments. In some embodiments, contact openings are formed in the dielectric layers 304 and 318. The contact openings expose the epitaxial structures 204A1, 204A2, 204B1, and 204B2. The contact openings may be formed using a photolithography process and an etching process.

Each of the contact openings has an upper portion in the dielectric layer 318 and a lower portion in the dielectric layer 304. The upper portion of the contact opening 320 may have a trench-like profile. The lower portion of the contact opening may have a hole-like profile. The profile of the upper portion may be defined using the photolithography process. The profile of the lower portion may be automatically defined since it is formed using a self-aligned manner. The metal gate stacks nearby may be used as etching mask elements to define the lower portion of the contact openings.

Afterwards, a conductive material layer is deposited over the dielectric layer 318 to fill the contact openings, in accordance with some embodiments. The conductive material layer may be made of or include tungsten, cobalt, titanium, platinum, gold, copper, aluminum, one or more other suitable materials, or a combination thereof. The conductive material layer may be deposited using an ALD process, a CVD process, a PVD process, an electroplating process, one or more other applicable processes, or a combination thereof.

Figure 3I:
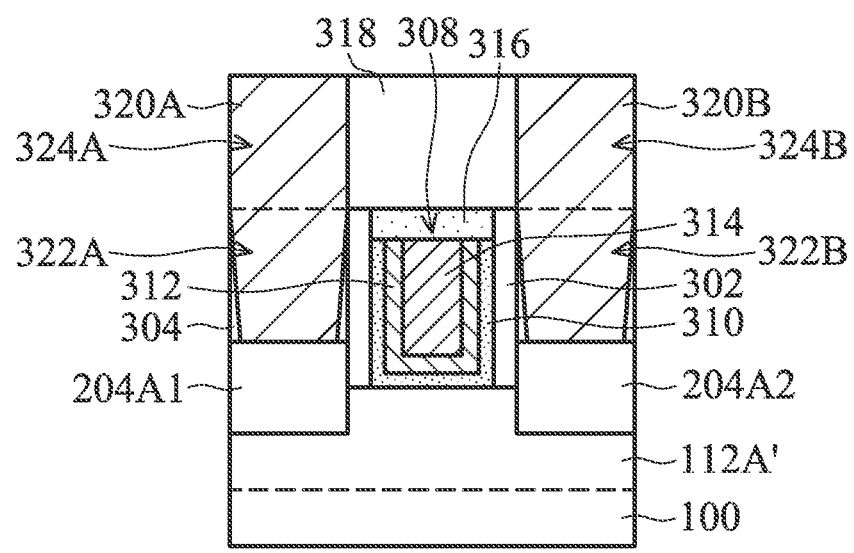
Figure 5F:
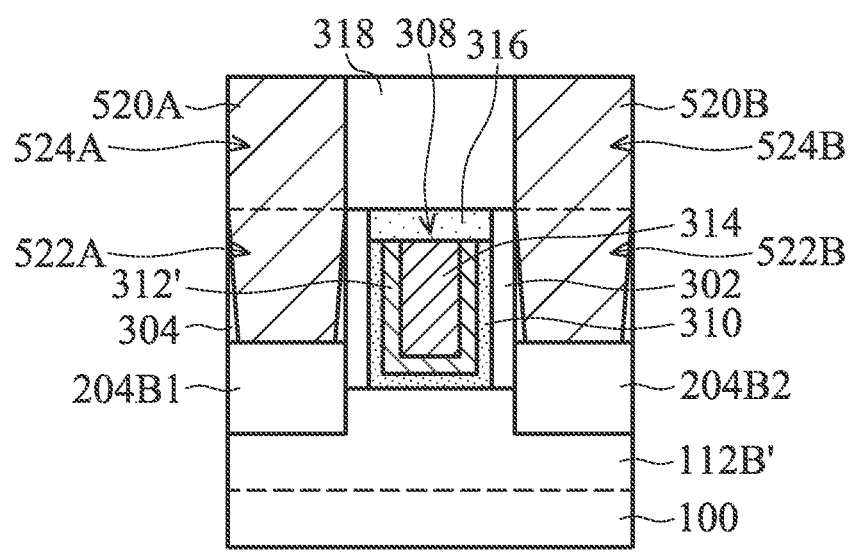

Afterwards, a planarization process is used to remove the conductive material layer outside of the contact openings, in accordance with some embodiments. As a result, the remaining portions of the conductive material layer in the contact openings form conductive contacts 320A, 320B, 520A, and 520B, as shown in FIGS. 3I and 5F in accordance with some embodiments. The planarization process mentioned above may include a CMP process, a grinding process, an etching process, a dry polishing process, one or more other applicable processes, or a combination thereof.

As shown in FIG. 3I, the conductive contacts 320A and 320B are electrically connected to the epitaxial structures 204A1 and 204A2, respectively. The conductive contact 320A has an upper portion 324A in the dielectric layer 318 and a lower portion 322A in the dielectric layer 304. The conductive contact 320B has an upper portion 324B in the dielectric layer 318 and a lower portion 322B in the dielectric layer 304.

As shown in FIG. 5F, the conductive contacts 520A and 520B are electrically connected to the epitaxial structures 204B1 and 204B2, respectively. The conductive contact 520A has an upper portion 524A in the dielectric layer 318 and a lower portion 522A in the dielectric layer 304. The conductive contact 520B has an upper portion 524B in the dielectric layer 318 and a lower portion 522B in the dielectric layer 304.

Figure 6:
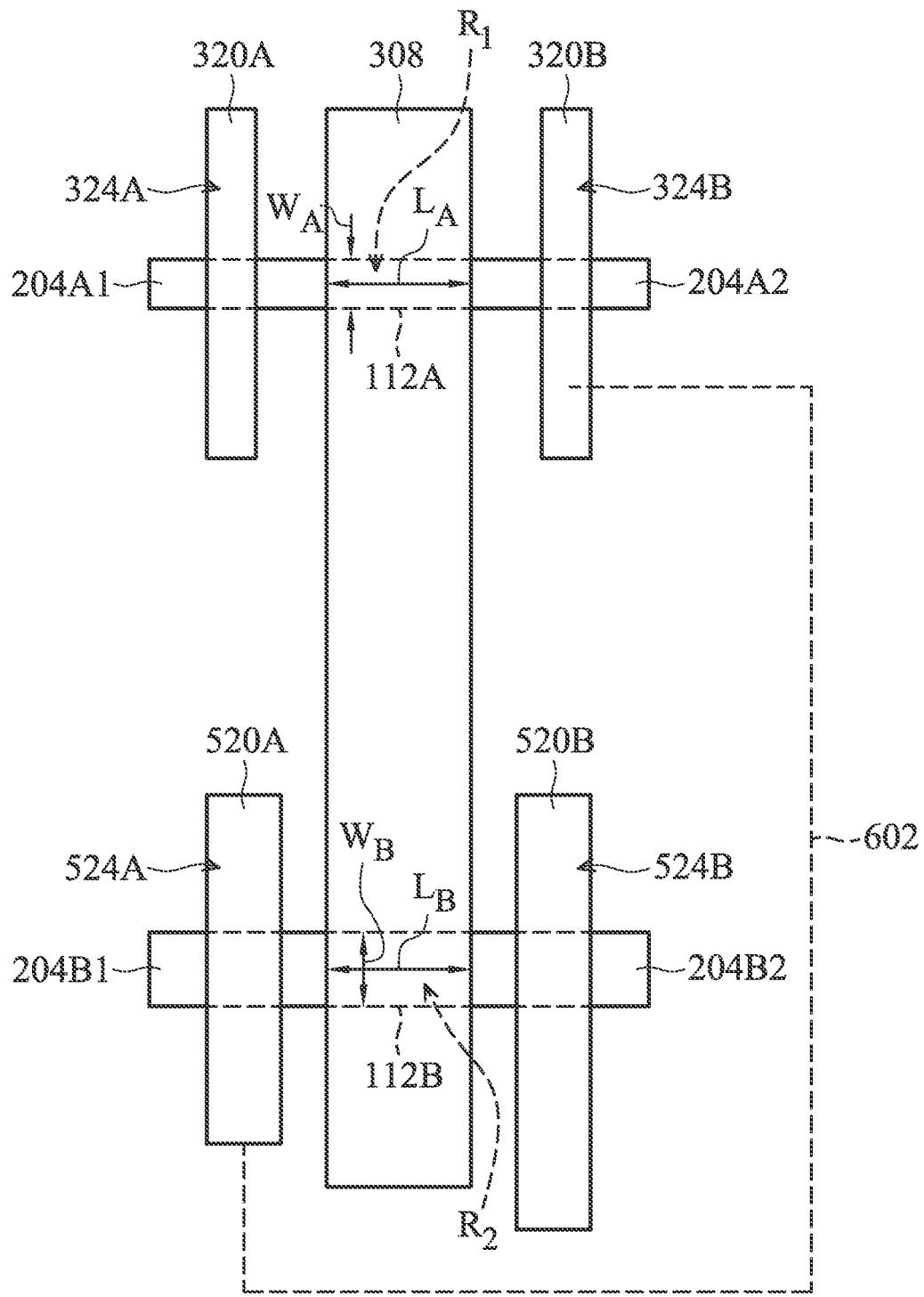
FIG. 6 is a top layout view of a semiconductor device structure, in accordance with some embodiments.

FIG. 6 is a top layout view of a semiconductor device structure, in accordance with some embodiments. In some embodiments, FIG. 6 shows the top layout view of the structure illustrated in FIGS. 3I and 5F.

In some embodiments, the upper portion 324A of the conductive contact 320A extends across the source/drain structure 204A1 thereunder, as shown in FIG. 6. The upper portion 324A of the conductive contact 320A is electrically connected to the source/drain structure 204A1 thereunder through the lower portion 322A of the conductive contact 320A, as shown in FIG. 3I. The upper portion 324A may have a line-like profile, and the lower portion 322A may have a plug-like profile. In some embodiments, the conductive contact 320A extends across no source/drain structure except for the source/drain structure 204A1 thereunder. That is, the conductive contact 320A extends across the source/drain structure 204A1 and no other source/drain structures.

Similarly, the upper portion 324B of the conductive contact 320B extends across the source/drain structure 204A2 thereunder, as shown in FIG. 6. The upper portion 324B of the conductive contact 320B is electrically connected to the source/drain structure 204A2 thereunder through the lower portion 322B of the conductive contact 320B. In some embodiments, the conductive contact 320B extends across no source/drain structure except for the only one source/drain structure 204A2 thereunder. That is, the conductive contact 320B extends across the source/drain structure 204A2 and no other source/drains structures.

In some embodiments, the upper portion 524A of the conductive contact 520A extends across the source/drain structure 204B1 thereunder, as shown in FIG. 6. The upper portion 524A of the conductive contact 520A is electrically connected to the source/drain structure 204B1 thereunder through the lower portion 522A of the conductive contact 520A, as shown in FIG. 5F. The upper portion 524A may have a line-like profile, and the lower portion 522A may have a plug-like profile. In some embodiments, the conductive contact 520A extends across no source/drain structure except for the source/drain structure 204B1 thereunder. That is, the conductive contact 520A extends across the source/drain structure 204B1 and no other source/drain structures.

Similarly, the upper portion 524B of the conductive contact 520B extends across the source/drain structure 204B2 thereunder, as shown in FIG. 6. The upper portion 524B of the conductive contact 520B is electrically connected to the source/drain structure 204B2 thereunder through the lower portion 522B of the conductive contact 520B, as shown in FIG. 5F. In some embodiments, the conductive contact 520B extends across no source/drain structure except for the source/drain structure 204B2 thereunder. That is, the conductive contact 520B extends across the source/drain structure 204B2 and no other source/drain structures.

In some embodiments, each of the conductive contacts 320A, 320B, 520A, and 520B is designed to extend across only one of the source/drain structures (or semiconductor fins). Each of the conductive contacts 320A, 320B, 520A, and 520B does not have to extend for a long distance to cover multiple source/drain structures (or semiconductor fins). The resistance of each of the conductive contacts 320A, 320B, 520A, and 520B may be reduced further. As a result, the overall resistance of the semiconductor device structure is reduced. The performance and reliability of the semiconductor device structure are improved.

In some embodiments, the elements illustrated in FIG. 6 serve as a CMOS device that includes a PMOS device and an NMOS device. In some embodiments, the epitaxial structure 204A2 of the PMOS device is electrically connected to the epitaxial structure 204B1 of the NMOS device. In some embodiments, the conductive contact 320B is electrically connected to the conductive contact 520A through an electrical connection 602. The electrical connection 602 may be achieved using an interconnection structure that may include one or more conductive vias and conductive lines. For example, other elements including dielectric layers, conductive vias, and conductive lines may be formed to establish the electrical connection 602.

Similar to the gate stack 122, the metal gate stack 308 extends across the semiconductor fins 112A and 112B to cover the regions $R_1$ and $R_2$, as shown in FIG. 6 in accordance with some embodiments. In some embodiments, the regions $R_1$ and $R_2$ are channel regions of a PMOS device and an NMOS device, respectively. In some other embodiments, portions of the regions $R_1$ and $R_2$ are channel regions of a PMOS device and an NMOS device, respectively. The region $R_2$ is wider than the region $R_1$. The metal gate stack 308 is used to control the channel regions.

In some embodiments, if the widths of the regions $R_1$ and $R_2$ become smaller, the metal gate stack 308 has a better control of the channel regions $R_1$ and $R_2$. The short channel effect issues may be reduced or prevented. However, in some cases, if the widths of the regions $R_1$ and $R_2$ are too small, the carrier mobility of the channel regions may be reduced. For example, in some cases, if the region $R_2$ is narrower than about 6 nm, the carrier mobility of the channel region (such as the region $R_2$) might be reduced significantly. In some cases, even if the region $R_1$ is in a range from about 4 nm to about 6 nm, the carrier mobility of the channel region (such as the region $R_1$) might not be reduced significantly. Therefore, in some embodiments, the region $R_1$ is designed to be narrower than the region $R_1$ to reduce the short channel effect and keep relatively high carrier mobility.

In some embodiments, the width $W_A$ is in a range from about 4 nm to about 6 nm. In some embodiments, the width $W_B$ is in a range from about 6 nm to about 7 nm. In some embodiments, a width different between the widths $W_B$ and $W_A$ ($W_B-W_A$) is in a range from about 0.5 nm to about 3 nm. In some embodiments, the width ratio ($W_B/W_A$) of the width $W_B$ to the width $W_A$ is in a range from about 1.05 to about 2. In some other embodiments, the width ratio ($W_B/W_A$) is in a range from about 1.1 to about 1.3. In some cases, if the width ratio ($W_B/W_A$) is smaller than about 1.05, the region $R_1$ might be too wide, causing the short channel effect in the region $R_1$ to negatively affect the performance of the semiconductor device structure. In some other cases, if the width ratio ($W_B/W_A$) is greater than about 2, the region $R_1$ might be too narrow and the carrier mobility in the region $R_1$ might be significantly reduced to negatively affect the performance of the semiconductor device structure.

Many variations and/or modifications can be made to embodiments of the disclosure. As mentioned above, in some other embodiments, the semiconductor fins 112A and 112B are separately formed using different etching processes. FIGS. 7A-7D are cross-sectional views of various stages of a process for forming a semiconductor device structure, in accordance with some embodiments.

In some embodiments, a structure the same as or similar to the structure shown in FIG. 1D is provided or received. Afterwards, a photolithography process and an etching process are used to pattern the semiconductor materials 104 and 108. As a result, semiconductor fins 112A' and 112B are formed. The semiconductor fin 112A' has a width $W_{A'}$, and the semiconductor fin 112B has the width $W_B$. In some embodiments, the width $W_{A'}$ is substantially equal to the width $W_B$.

Figure 7A:
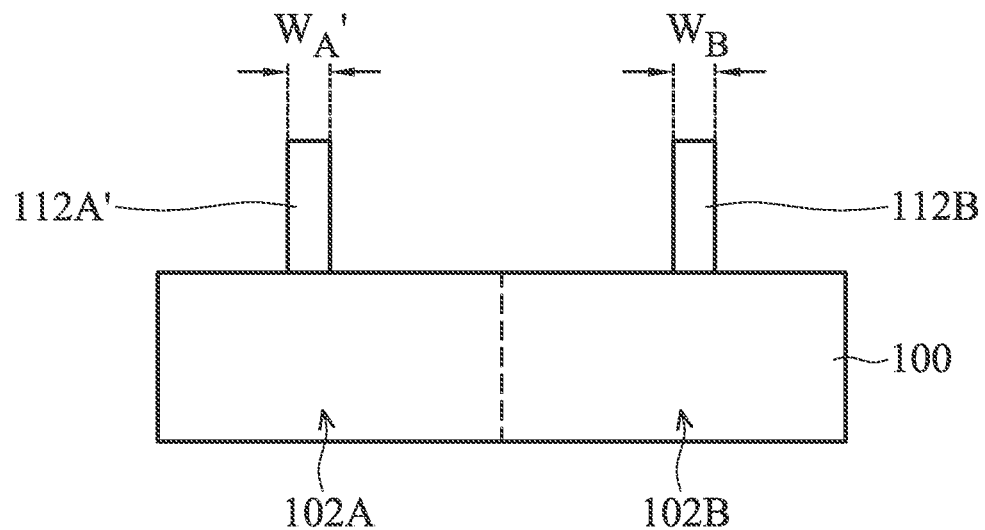
FIGS. 7A-7D are cross-sectional views of various stages of a process for forming a semiconductor device structure, in accordance with some embodiments.
Figure 7B:
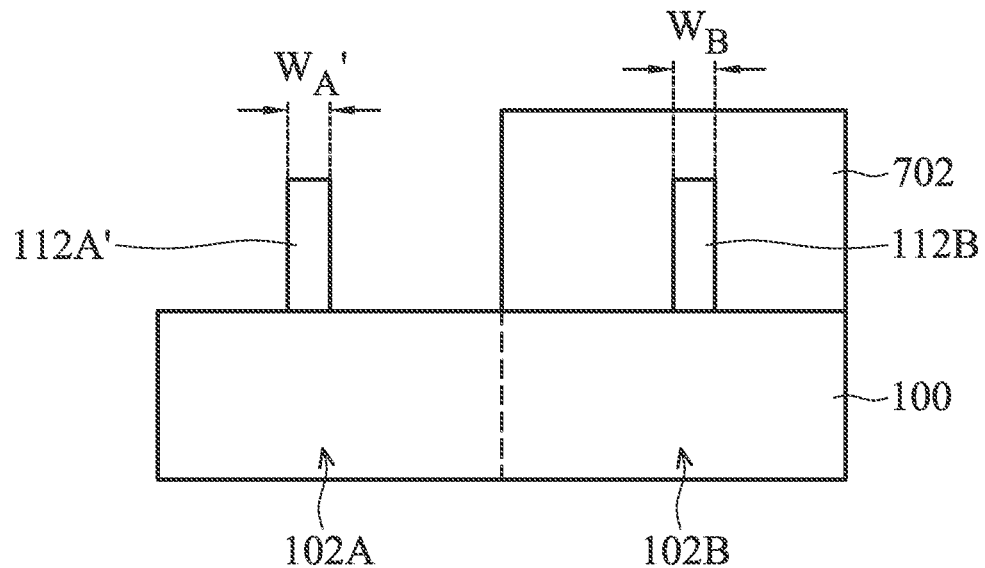

As shown in FIG. 7B, a mask element 702 is formed over the semiconductor substrate 100 to cover the semiconductor fin 112B, in accordance with some embodiments. The mask element 702 has an opening that exposes the semiconductor fin 112A'.

Figure 7C:
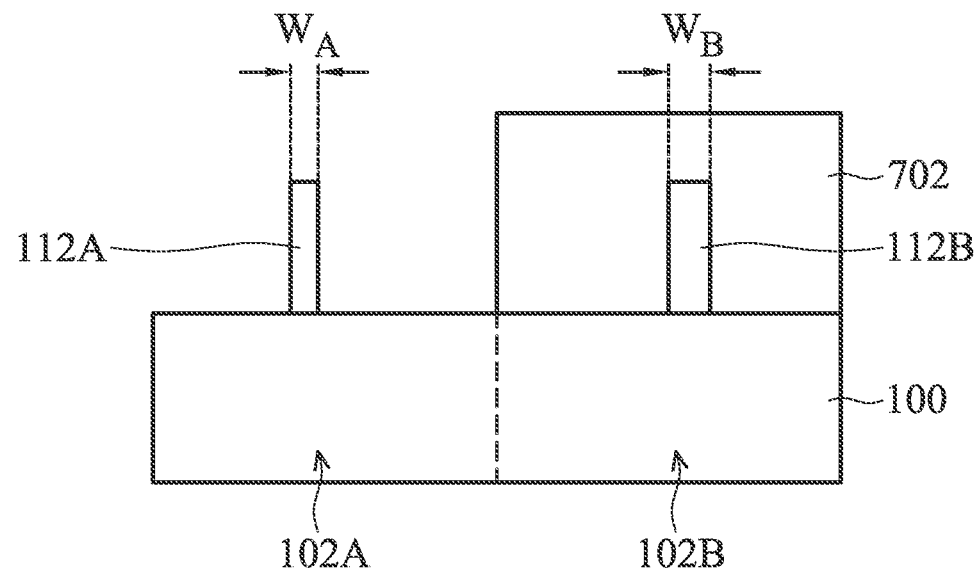
Figure 7D:
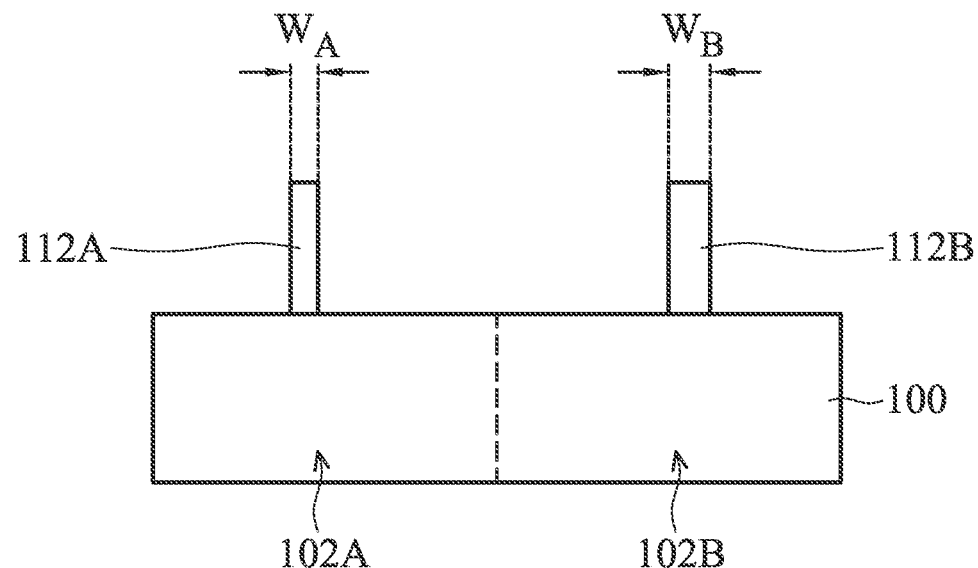

As shown in FIG. 7C, another etching process is used to partially remove the semiconductor fin 112A', in accordance with some embodiments. As a result, the semiconductor fin 112A with the width $W_A$, that is smaller than the width $W_{A'}$, is formed. The semiconductor fin 112B is thus wider than the semiconductor fin 112A. Afterwards, the mask element 702 is removed, as shown in FIG. 7D in accordance with some embodiments. In these cases, the semiconductor fins 112A and 112B having different widths are separately formed using different etching processes.

Embodiments of the disclosure form a semiconductor device structure including a PMOS device and an NMOS device. The PMOS device and the NMOS device share the same gate stack. Each or one of the PMOS device and the NMOS device includes only one semiconductor fin. Therefore, a conductive structure (such as a conductive contact) electrically connected to the source/drain structure formed on the semiconductor fin does not have to extend across multiple fins. The length of the conductive structure is thus relatively short and has less resistance. The channel regions of the PMOS device and the NMOS device are made of different materials. For example, the channel region of the PMOS device is made of or includes silicon germanium, and the channel region of the NMOS device is made of silicon. The performance of the PMOS device is improved. The channel region of the PMOS device is designed to be narrower than the channel region of the NMOS device. The short channel effect in the channel region of the PMOS device may be reduced while the carrier mobility in the channel region of the PMOS device may still be high. The quality and reliability of the semiconductor device structure are significantly improved.

In accordance with some embodiments, a method for forming a semiconductor device structure is provided. The method includes forming a first semiconductor fin and a second semiconductor fin over a semiconductor substrate. The second semiconductor fin is wider than the first semiconductor fin. The method also includes forming a gate stack over the semiconductor substrate, and the gate stack extends across the first semiconductor fin and the second semiconductor fin. The method further includes forming a first source/drain structure on the first semiconductor fin, and the first source/drain structure is p-type doped. In addition, the method includes forming a second source/drain structure on the second semiconductor fin, and the second source/drain structure is n-type doped.

In accordance with some embodiments, a method for forming a semiconductor device structure is provided. The method includes forming a first semiconductor fin and a second semiconductor fin over a semiconductor substrate. The first semiconductor fin and the second semiconductor fin are made of different materials. The method also includes forming a gate stack over the semiconductor substrate. The gate stack extends across the first semiconductor fin and the second semiconductor fin and no other semiconductor fins. The method further includes forming a first source/drain structure on the first semiconductor fin, and the first source/drain structure is p-type doped. In addition, the method includes forming a second source/drain structure on the second semiconductor fin, and the second source/drain structure is n-type doped.

In accordance with some embodiments, a semiconductor device structure is provided. The semiconductor device structure includes a semiconductor substrate. The semiconductor device structure also includes a first semiconductor fin and a second semiconductor fin over the semiconductor substrate. The semiconductor device structure further includes a gate stack over the semiconductor substrate. The gate stack extends across the first semiconductor fin and the second semiconductor fin to cover a first region of the first semiconductor fin and a second region of the second semiconductor fin. The second region is wider than the first region. In addition, the semiconductor device structure includes a first source/drain structure on the first semiconductor fin and adjacent to the first region, and the first source/drain structure is p-type doped. The semiconductor device structure also includes a second source/drain structure on the second semiconductor fin and adjacent to the second region, and the second source/drain structure is n-type doped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a complementary metal-oxide-semiconductor (CMOS) transistor, the method comprising:
    forming a p-type silicon layer over a first region of a substrate;
    forming an n-type silicon germanium layer over a second region of the substrate;
    simultaneously etching the p-type silicon layer to have a first width and the n-type silicon germanium layer to have a second width that is less than the first width, wherein the etched p-type silicon layer having the first width is a p-type silicon fin and the etched n-type silicon germanium layer having the second width is an n-type silicon germanium fin, wherein:
        an n-type single-fin transistor of the CMOS transistor includes the p-type silicon fin and a p-type single-fin transistor of the CMOS transistor includes the n-type silicon germanium fin, and
        the p-type silicon layer and the n-type silicon germanium layer are simultaneously etched to have an etched width difference between the first width and the second width that is 0.5 nm to 3 nm and an etched width ratio of the first width to the second width that is 1.1 to 1.3;
    forming a gate that wraps a channel portion of the p-type silicon fin and a channel portion of the n-type silicon germanium fin, wherein the gate is shared by the n-type single-fin transistor and the p-type single-fin transistor;
    recessing source/drain portions of the p-type silicon fin and recessing source/drain portions of the n-type silicon germanium fin; and
    forming n-type epitaxial source/drain structures on the recessed source/drain portions of the p-type silicon fin and p-type epitaxial source/drain structures on the recessed source/drain portions of the n-type silicon germanium fin, wherein the n-type single-fin transistor includes the n-type epitaxial source/drain structures and the p-type single-fin transistor includes the p-type epitaxial source/drain structures.

2. The method of claim 1, wherein the first width is 6 nm to 7 nm and the second width is 4 nm to 6 nm.

3. The method of claim 1, wherein the gate does not wrap a channel portion of another semiconductor fin.

4. The method of claim 1, further comprising:
forming a first source/drain contact that physically contacts one of the p-type epitaxial source/drain structures of the p-type single-fin transistor;
forming a second source/drain contact that physically contacts one of the n-type epitaxial source/drain structures of the n-type single-fin transistor; and
wherein the first source/drain contact and the second source/drain contact extend along a longitudinal direction of the gate, the first source/drain contact does not extend over other fins, and the second source/drain contact does not extend over other fins.

5. The method of claim 4, further comprising forming an interconnect structure that electrically connects the first source/drain contact and the second source/drain contact.

6. A transistor comprising:
p-type epitaxial source/drain structures of a p-type single-fin transistor;
n-type epitaxial source/drain structures of an n-type single-fin transistor;
a gate stack shared by the p-type single-fin transistor and the n-type single-fin transistor, wherein that gate stack extends along a first lengthwise direction, the gate stack is disposed between the p-type epitaxial source/drain structures, the gate stack is disposed between the n-type epitaxial source/drain structures, the gate stack wraps an n-type silicon germanium fin of the p-type single-fin transistor, and the gate stack wraps a p-type silicon fin of the n-type single-fin transistor;
wherein the n-type silicon germanium fin of the p-type single-fin transistor is arranged between the p-type epitaxial source/drain structures of the p-type single-fin transistor along a second lengthwise direction that is different than the first lengthwise direction and the p-type silicon fin of the n-type single-fin transistor is arranged between the n-type epitaxial source/drain structures of the n-type single-fin transistor along the second lengthwise direction;
wherein the p-type silicon fin of the n-type single-fin transistor has a first etched width, the n-type silicon germanium fin of the p-type single-fin transistor has a second etched width, and the first etched width and the second etched width are along the first lengthwise direction; and
wherein the first etched width of the p-type silicon fin is 0.5 nm to 3 nm greater than the second etched width of the n-type silicon germanium fin and a ratio of the first etched width of the p-type silicon fin to the second etched width of the n-type silicon germanium fin is 1.1 to 1.3.

7. The transistor of claim 6, wherein the gate stack does not wrap other fins.

8. The transistor of claim 6, wherein the p-type epitaxial source/drain structures of the p-type single-fin transistor are disposed on recessed portions of the n-type silicon germanium fin and the n-type epitaxial source/drain structures of the n-type single-fin transistor are disposed on recessed portions of the p-type silicon fin.

9. The transistor of claim 8, wherein the p-type epitaxial source/drain structures of the p-type single-fin transistor have a first cross-sectional profile and the n-type epitaxial source/drain structures of the n-type single-fin transistor have a second cross-sectional profile that is different than the first cross-sectional profile.

10. The transistor of claim 6, wherein:
the first etched width of the p-type silicon fin is 6 nm to 7 nm; and
the second etched width of the n-type silicon germanium fin is 4 nm to 6 nm.

11. The transistor of claim 6, wherein an atomic concentration of germanium in the n-type silicon germanium fin is 10% to 40%.

12. The transistor of claim 6, wherein:
a first source/drain contact physically contacts a first one of the p-type epitaxial source/drain structures of the p-type single-fin transistor;
a second source/drain contact physically contacts a second one of the p-type epitaxial source/drain structures of the p-type single-fin transistor;
a third source/drain contact physically contacts a first one of the n-type epitaxial source/drain structures of the n-type single-fin transistor;
a fourth source/drain contact physically contacts a second one of the n-type epitaxial source/drain structures of the n-type single-fin transistor; and
the first source/drain contact, the second source/drain contact, the third source/drain contact, and the fourth source/drain contact extend along the first lengthwise direction.

13. The transistor of claim 12, wherein the first source/drain contact is electrically connected to the third source/drain contact.

14. A complementary metal-oxide-semiconductor (CMOS) transistor comprising:
a PMOS transistor having p-type epitaxial source/drains and a single n-type silicon germanium projection from a silicon substrate, wherein the single n-type silicon germanium projection is between the p-type epitaxial source/drains, a PMOS channel is formed by the single n-type silicon germanium projection, and the p-type epitaxial source/drains extend from recessed n-type silicon germanium projections from the silicon substrate;
an NMOS transistor having n-type epitaxial source/drains and a single p-type silicon projection that extends from the silicon substrate, wherein the single p-type silicon projection is between the n-type epitaxial source/drains and an NMOS channel is formed by the single p-type silicon projection and the n-type epitaxial source/drains extend from recessed p-type silicon projections from the silicon substrate;
wherein the PMOS transistor and the NMOS transistor have a common gate that covers a top of the single n-type silicon germanium projection and a top of the single p-type silicon projection, the top of the single p-type silicon projection has a first etched width, the top of the single n-type silicon germanium projection has a second etched width that is less than the first etched width, and the first etched width and the second etched width are along a longitudinal direction of the common gate; and
the first etched width of the single p-type silicon projection is about 6 nm to about 7 nm, the second etched width of the single n-type silicon germanium projection is about 4 nm to about 6 nm, an etched width difference between the first etched width of the single p-type silicon projection and the second etched width of the single n-type silicon germanium projection is 0.5 nm to 3 nm, and an etched width ratio of the first etched width of the single p-type silicon projection to the second etched width of the single n-type silicon germanium projection is 1.1 to 1.3.

15. The CMOS transistor of claim 14, wherein the common gate does not cover tops of channels formed from other semiconductor projections from the silicon substrate.

16. The CMOS transistor of claim 14, wherein an atomic concentration of germanium in the single n-type silicon germanium projection is greater than 10% and less than 40%.

17. The CMOS transistor of claim 14, wherein a first gate width of the common gate over the single p-type silicon projection is substantially the same as a second gate width of the common gate over the single n-type silicon germanium projection, wherein the first gate width and the second gate width are along a direction substantially orthogonal to the longitudinal direction of the common gate.

18. The CMOS transistor of claim 14, wherein the p-type epitaxial source/drains of the PMOS transistor have a first cross-sectional profile and the n-type epitaxial source/drains of the NMOS transistor have a second cross-sectional profile different than the first cross-sectional profile.

19. The CMOS transistor of claim 14, wherein:
a first source/drain contact physically contacts one of the p-type epitaxial source/drains of the PMOS transistor and a second source/drain contact physically contacts one of the n-type epitaxial source/drains of the NMOS transistor; and
the first source/drain contact and the second source/drain contact extend along the longitudinal direction of the common gate, the first source/drain contact does not extend over more than one recessed n-type silicon germanium projection from the silicon substrate, and the second source/drain contact does not extend over more than one recessed p-type silicon projection from the silicon substrate.

20. The CMOS transistor of claim 19, wherein the first source/drain contact is electrically connected to the second source/drain contact.

* * * * *